United States Patent [19]
Hashimoto et al.

[11] Patent Number: 5,527,662
[45] Date of Patent: *Jun. 18, 1996

[54] PROCESS FOR FORMING FINE PATTERN

[75] Inventors: Kazuhiko Hashimoto, Moriguchi; Noboru Nomura, Kyoto, both of Japan

[73] Assignee: Matsushita Electric Industrial Co., Ltd., Osaka, Japan

[*] Notice: The term of this patent shall not extend beyond the expiration date of Pat. No.5,252,430.

[21] Appl. No.: 185,237

[22] Filed: Jan. 24, 1994

Related U.S. Application Data

[60] Continuation of Ser. No. 944,904, Sep. 15, 1992, abandoned, which is a division of Ser. No. 695,328, May 3, 1991, Pat. No. 5,198,326.

[30] Foreign Application Priority Data

May 24, 1990 [JP] Japan ................... 2-135062

[51] Int. Cl.$^6$ .............. G03C 5/00; G03F 7/038; G03F 7/38; G03F 7/40
[52] U.S. Cl. ............ 430/296; 430/270.1; 430/313; 430/317; 430/323; 430/325; 430/330; 156/643.1; 156/661.11; 216/2; 216/44; 216/47; 216/49; 216/51; 216/74
[58] Field of Search ................. 430/296, 942, 430/270, 313, 317, 323, 325, 330, 329, 270.1; 156/659.1, 668, 904, 661.1, 643, 659.11, 661.11, 643.1; 216/2, 49, 44, 47, 51, 81, 74

[56] References Cited

U.S. PATENT DOCUMENTS

| | | | |
|---|---|---|---|
| 4,532,005 | 7/1985 | Grieco et al. | 156/659.1 |
| 4,702,993 | 10/1987 | White et al. | 430/296 |
| 4,738,916 | 4/1988 | Namatsu et al. | 430/272 |
| 4,800,152 | 1/1989 | Allen et al. | 430/270 |
| 4,939,070 | 7/1990 | Brunsvold et al. | 430/942 |
| 4,968,583 | 11/1990 | Ohshio et al. | 430/296 |
| 4,976,818 | 12/1990 | Hashimoto et al. | 430/317 |
| 5,019,485 | 5/1991 | Nakamura et al. | 430/325 |
| 5,024,916 | 6/1991 | steinmann | 430/326 |
| 5,093,224 | 3/1992 | Hashimoto et al. | 430/323 |
| 5,139,922 | 8/1992 | Watanabe et al. | 430/296 |
| 5,169,494 | 12/1992 | Hashimoto et al. | 430/270 |
| 5,252,430 | 10/1993 | Hashimoto et al. | 430/296 |
| 5,266,424 | 11/1993 | Fujino et al. | 430/296 |
| 5,316,891 | 5/1994 | Hashimoto et al. | 430/296 |

FOREIGN PATENT DOCUMENTS

| | | | |
|---|---|---|---|
| 0419147 | 3/1991 | European Pat. Off. | 430/270 |
| 63-241542 | 10/1988 | Japan . | |
| 64-35433 | 2/1989 | Japan . | |
| 1060038 | 4/1989 | Japan . | |
| 2-23355 | 1/1990 | Japan . | |
| 2-101461 | 4/1990 | Japan | 430/942 |
| 2-150848 | 6/1990 | Japan . | |
| 3-42664 | 2/1991 | Japan . | |
| 3-103854 | 4/1991 | Japan . | |
| 3-137649 | 6/1991 | Japan | 430/270 |

*Primary Examiner*—Janis L. Dote
*Attorney, Agent, or Firm*—Watson Cole Stevens Davis

[57] ABSTRACT

In a process using a single-layer or multi-layer resist, by using a resist material comprising an acid-decomposable polymer, an acid generator and a conducting polymer or a resist material comprising a monomer to be made reactive by an acid, an acid generator and a conducting polymer, there can be formed a fine pattern precisely without inviting charging during charged beam writing.

6 Claims, 5 Drawing Sheets

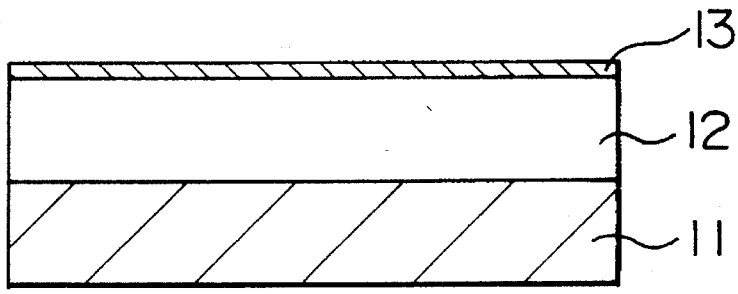
F I G. IA
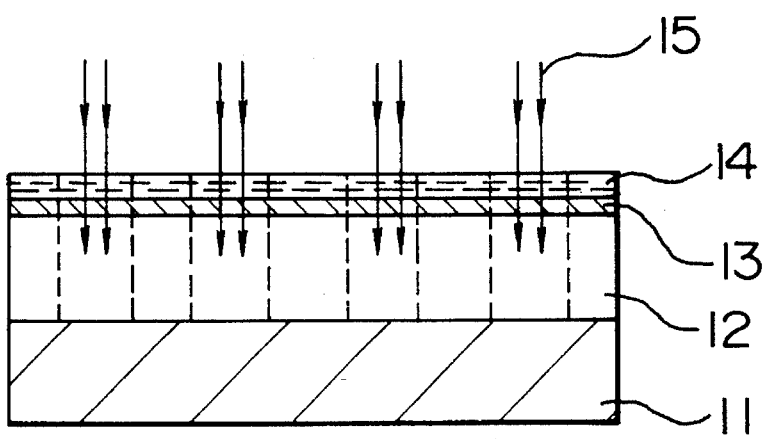
F I G. IB
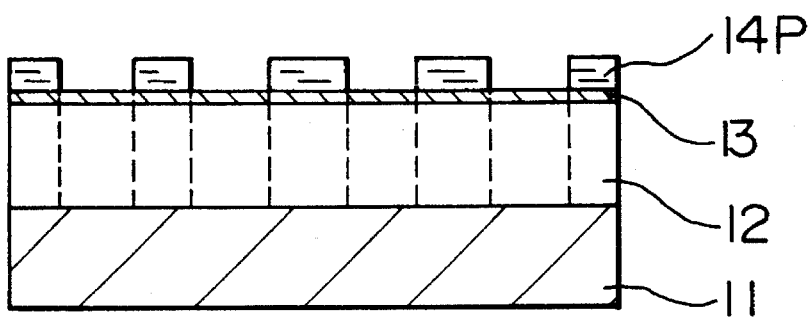
F I G. IC
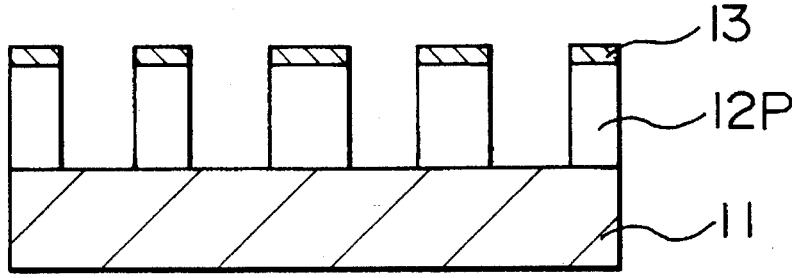
F I G. ID

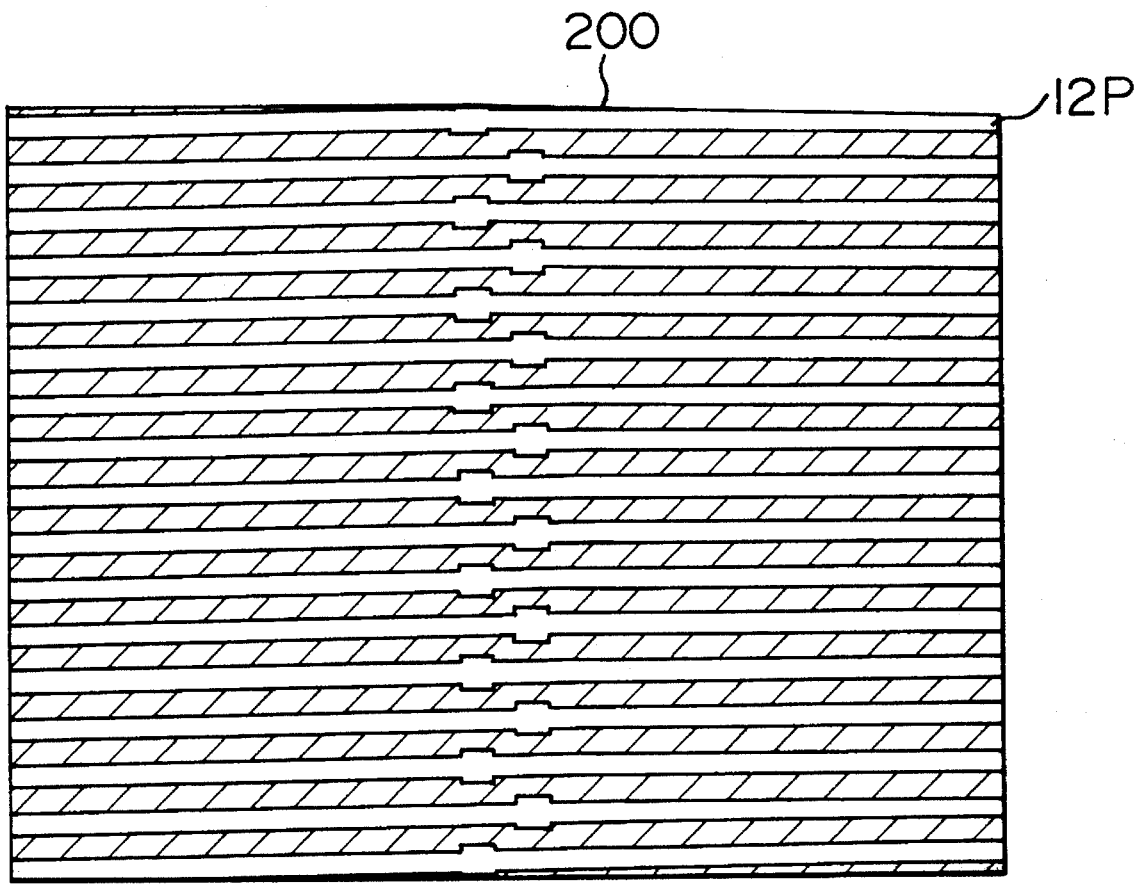
F I G. 3

PROCESS FOR FORMING FINE PATTERN

This application is a continuation of application Ser. No. 07/944,904, filed Sep. 15, 1992 (abandoned) which is a divisional application of Ser. No. 07/695,328, filed May 3, 1991, which issued as U.S. Pat. No. 5,198,326 on Mar. 30, 1993.

BACKGROUND OF THE INVENTION

1. Field of the Invention

The present invention relates to a process for forming a fine pattern employed in pattern formation by a charged beam (e.g. electron beam, focus ion beam) direct writing to obtain a semiconductor device or an integrated circuit.

2. Description of the Prior Art

In production of electronic devices such as IC, LSI, and the like, pattern formation has hitherto been conducted by photolithography using ultraviolet rays. As the pattern dimensions of these devices have become finer, it is suggested to use a stepper lens of higher numerical aperture (NA), a light source of shorter wavelength, etc., but it invites a drawback of smaller focus depth. Further, electron beam lithography has come to be used as the pattern dimension of LSI devices has become finer and the production of ASIC has started.

In the fine pattern formation by electron beam lithography, a positive type electron beam resist is requisite. A polymethyl methacrylate (PMMA) is known as a positive type electron beam giving the highest resolution, but has a drawback of low sensitivity.

Therefore, there have been presented, in recent years, many reports concerning the enhancement of sensitivity of positive type electron beam resists. These reports propose positive type electron beam resists of, for example, polybutyl methacrylate, a copolymer of methyl methacrylate and methacrylic acid, a compolymer of methacrylic acid and acrylonitrile, a copolymer of methyl methacrylate and isobutylene, polybutene-1-sulfone, poly(isopropenyl ketone) and fluoro polymethacrylate.

In all of these resists, in order to obtain a high sensitivity, an electron withdrawing group has been introduced into the side chain or an easily decomposable bond has been introduced into the principal chain to allow the principal chain to undergo easy scission by electron beam. However, they do not fully satisfy both of resolution and sensitivity. Further, they are not sufficiently good in dry etch resistance and heat resistance. Consequently, it is difficult to use them as a mask for dry etching and their usages are limited.

Meanwhile, negative type electron beam resists using a cyclized rubber as a base have drawbacks in that they have low adhesion to a substrate, are difficult to form a uniform high-quality film with no pinholes on a substrate, and have low thermal stability and resolution. Therefore, various improvements have hitherto been made for negative type electron beam resists. As a result, there have been proposed negative type electron beam resists such as poly(glycidyl methacrylate), chloromethylated polystyrene, chloromethylated α-methyl polystyrene, polymethacrylate maleic acid ester, chlorinated polystyrene, glycidyl methacrylate-ethyl acrylate copolymer and the like. In all of these resists, epoxy groups or chlorine atoms, sensitive to electrons, have been introduced in order to allow them to generate radicals easily when irradiated with an electron beam and give rise to a crosslinking reaction. The above resists are intended to have a high sensitivity but are not sufficient in any of resolution and heat resistance.

In developing a negative type resist using a rubbery thermoplastic polymer (e.g. the above cyclized rubber or a polyisoprene) as a base, an organic solvent is required as a developer. In some cases, this organic solvent developer causes swelling of an image-written resist during the development of the resist, which reduces the resolution of pattern and, in some cases, invites distortion of pattern and makes the pattern unusable. Moreover, the organic solvent developer is harmful from the standpoints of environment and human health and additionally has flammability.

Electron beam lithography has various drawbacks such as poor dry etch resistance and heat resistance of an electron beam resist, adverse effect of proximate effect caused by forward or backward scattering of electron on pattern precision, adverse effect of charging of incident electrons on pattern writing, and the like.

In order to improve these drawbacks, use of a multi-layer resist consisting of a pattern forming layer and a planarizing layer is very effective. FIGS. 4A to 4D are illustrations explaining a process for forming a tri-layer resist by electron beam lithography. In order to expect a reduced proximate effect, a high-molecular weight organic film as a bottom layer 31 is formed on a substrate 11 in a thickness of 2–3 μm and then a heat treatment is effected (FIG. 4A). Thereon is formed, as an intermediate layer 32, an inorganic film of $SiO_2$ or the like or an inorganic high-molecular weight film of SOG (spin on glass) or the like in a thickness of 0.2 μm. Thereon is formed, as a top layer 33, an electron beam resist in a thickness of 0.5 μm. Thereon is vapor-deposited a thin aluminum film 34 in a thickness of about 100 Å in order to prevent the charging (FIG. 4B). Then, writing by an electron beam 35 is effected; the thin aluminum film is removed with an aqueous alkali solution; and development is effected to obtain a resist pattern 33P (FIG. 4C). Thereafter, the intermediate layer is dry-etched using the resist pattern as a mask, after which the bottom layer is dry-etched using the intermediate layer as a mask (FIG. 4D). By employing the above process using a multi-layer resist, a fine pattern can be formed at a high aspect ratio. However, in the process using a multi-layer resist on which a thin aluminum film is vapor-deposited, the steps are more complex; contamination is higher; dimensional change in pattern transfer is larger; thus, the process using the multi-layer resist is not practical.

As shown in FIG. 5, in the conventional process using a tri-layer resist, it occurs in some cases that a width of 0.5 μm in design pattern 40 becomes thinner to about 0.3 μm.

As mentioned above, the process using a multi-layer resist having a thin aluminum film thereon is effective, but has various drawbacks such as complex steps, aluminum contamination, change in resist dimension during pattern transfer, and the like.

In the process using a multi-layer resist having no thin aluminum film, there is a problem of charging. This charging is a phenomenon in which incident electrons are accumulated in the resist, the intermediate layer or the bottom layer, all being an insulator. The charging invites serious problems in electron beam lithography, for example, reduction in field butting accuracy and overlay accuracy. The charging is also seen in a single-layer resist and, as in the tri-layer resist, invites reduction in field butting accuracy and overlay accuracy. That is, in electron beam lithography, incident electrons are scattered in the resist but stop at a depth of 1–1.5 μm from the resist surface, whereby the incident electrons are accumulated in the resist pattern at the depth.

It is thought that these accumulated electrons cause deflection of electron beam, which in turn invites reduction in field butting accuracy and overlay accuracy.

FIG. 6 is a drawing showing the surface of a pattern formed in a process using a tri-layer resist having no aluminum film thereon, prepared based on a scanning electron micrograph of said surface. It shows that charging has caused field butting error and pattern breakage. That is, when electron beam exposure is effected by scanning an electron beam over a region A as shown in an arrow O and then over a region B as shown in an arrow P to connect the regions A and B, the presence of charging (accumulated electrons) causes breakage (field butting error) 100 between the region A and the region B in the resist pattern 50 after development.

The present inventors completed an electron beam resist having high sensitivity and conductivity, capable of solving the above problems, as well as a process for forming a fine pattern using the resist.

SUMMARY OF THE INVENTION

An object of the present invention is to provide a process for forming a fine resist pattern easily and precisely, wherein charging by electrons or charged particles is prevented at the time of direct writing by a charged beam such as electron beam, focus ion beam or the like and a multi-layer resist is used.

In order to achieve the above object, the present invention provides a process for forming a fine pattern, which comprises:

- a step of forming a high-molecular weight (hereinafter "high-molecular organic film") organic film on a semiconductor substrate, followed by a heat treatment,
- a step of forming an inorganic film on the resulting high-molecular organic film, followed by a heat treatment,
- a step of forming, on the resulting inorganic film, a resist film comprising an acid-decomposable polymer, a photo acid generator generating an acid upon irradiation with a charged beam and a conducting polymer, followed by a heat treatment,
- a step of irradiating the resulting resist film with a charged beam to write a pattern and generate the acid, followed by a heat treatment to react the generated acid with the acid-decomposable polymer, and then effecting development to form a resist pattern, and
- a step of etching the inorganic film and the high-molecular organic film using the resist pattern as a mask.

The present invention also provides a process for forming a fine pattern, which comprises:

- a step of forming a high-molecular organic film on a semiconductor substrate, followed by a heat treatment,
- a step of forming an inorganic film on the resulting high-molecular organic film, followed by a heat treatment,
- a step of forming, on the resulting inorganic film, a resist film comprising a monomer to be made reactive by an acid, a photo acid generator generating an acid upon irradiation with a charged beam and a conducting polymer, followed by a heat treatment,
- a step of irradiating the resulting resist film with a charged beam to write a pattern and generate the acid, followed by a heat treatment to react the generated acid with the monomer to be made reactive by an acid and thereby react said monomer with the conducting polymer, and then effecting development to form a resist pattern, and
- a step of etching the inorganic film and the high-molecular organic film using the resist pattern as a mask.

BRIEF DESCRIPTION OF THE DRAWINGS

FIGS. 1A to 1D are sectional views showing an example of the steps of the process for forming a fine pattern of the present invention.

FIG. 3 is an illustration of the surface of the resist pattern formed in Example 3 of the present invention, prepared based on the scanning electron micrograph of the surface.

DESCRIPTION OF THE PREFERRED EMBODIMENTS

Figure 2A:
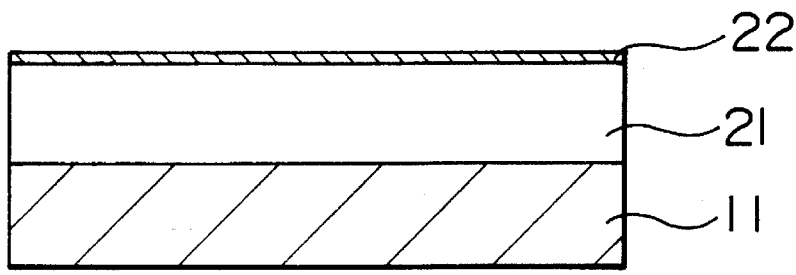
FIGS. 2A to 2D are sectional views showing other example of the steps of the process for forming a fine pattern of the present invention.

The present invention solves the above-mentioned problems of the conventional process, by using a resist which is a three-component system comprising a photo acid generator capable of generating an acid upon irradiation with an electron beam (this photo acid generator is hereinafter referred to simply as "photo acid generator"), a polymer decomposable by the acid or a monomer to be made reactive by the acid, and a conducting polymer.

The photo acid generator includes organic halide compounds, onium salts, etc. Examples of the organic halide compounds are 1,1-bis(p-chlorophenyl)-2,2,2-trichloroethane, 1,1-bis(p-methoxyphenyl)-2,2,2-trichloroethane, 1,1-bis(p-chlorophenyl)-2,2-dichloroethane, and 2-chloro-6-(trichloromethyl)pyridine. Examples of the onium salts are

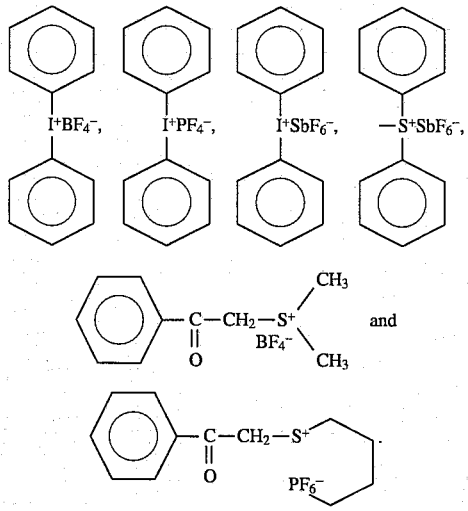

Each of these photo acid generators generates a Lewis acid (a strong acid) when irradiated with an electron beam.

The acid-decomposable polymer is decomposed by the Lewis acid mentioned above and preferably has a C—O—C bond in the principal or side chain. The acid-decomposable polymer includes, for example,

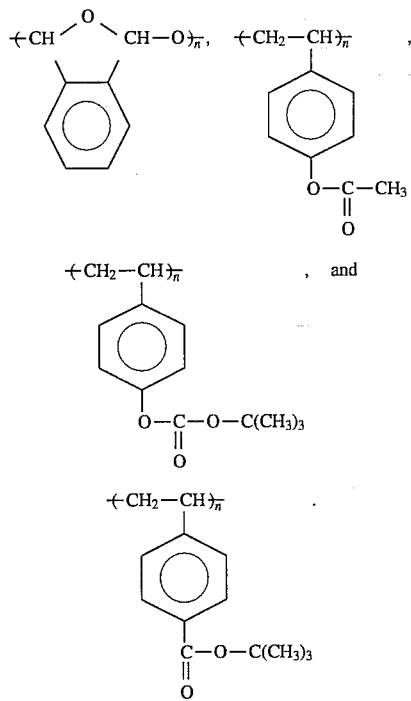

Each of these acid-decomposable polymers is reacted (decomposed) as follows in the presence of an acid and converted to an alkali-soluble substance.

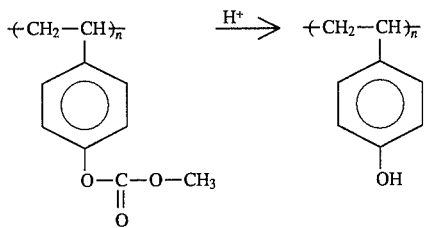

The conducting polymer is used as a matrix polymer and must be solvent-soluble. It includes, for example, the following polymers.

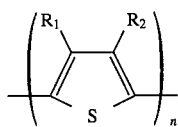

($R_1$ and $R_2$ are an alkyl group and may be the same or different.)

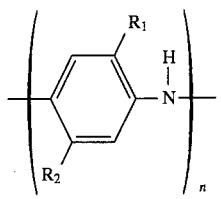

($R_1$ and $R_2$ are an alkyl group and may be the same or different.)

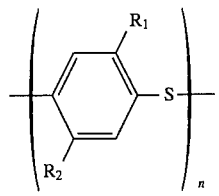

($R_1$ and $R_2$ are an alkyl group and may be the same or different.)

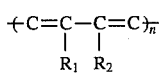

($R_1$ and $R_2$ are an alkyl group and may be the same or different.)

When exposed to an electron beam, the photo acid generator generates a Lewis acid. The acid decomposes the acid-decomposable polymer having a C—O—C bond into a lower-molecular compound which is soluble in a developer. The acid-decomposable polymer functions as a solution inhibitor in the unexposed portions of the resist; therefore the unexposed portions are difficultly soluble in the developer. Thus, a positive type resist pattern is formed.

Further, the resist film comprising the photo acid generator, the acid-decomposable polymer and the conducting polymer can prevent charging at the time of electron beam writing because the film contains the conducting polymer and has a low surface resistance.

By using these three components as a top-layer resist for tri-layer resist, there can be easily formed a multi-layer resist having a sufficiently high sensitivity as a result of chemical sensitization and also having conductivity; consequently, a positive type fine resist pattern can be formed precisely without inviting any pattern distortion caused by charging.

The above-mentioned problems of the conventional process can also be solved by using, as a result, a three-component system comprising a photo acid generator generating an acid when irradiated with an electron beam, a monomer to be made reactive by the acid, and a conducting polymer.

The photo acid generator includes organic halide compounds, onium salts, etc. as mentioned above.

The monomer to be made reactive by an acid, includes melamine and methylolmelamine. The methylolmelamine has the following chemical formula.

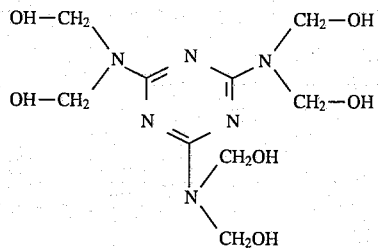

Methylolmelamine loses the —OH groups in the presence of an acid and reacts with the conducting polymer which is a matrix.

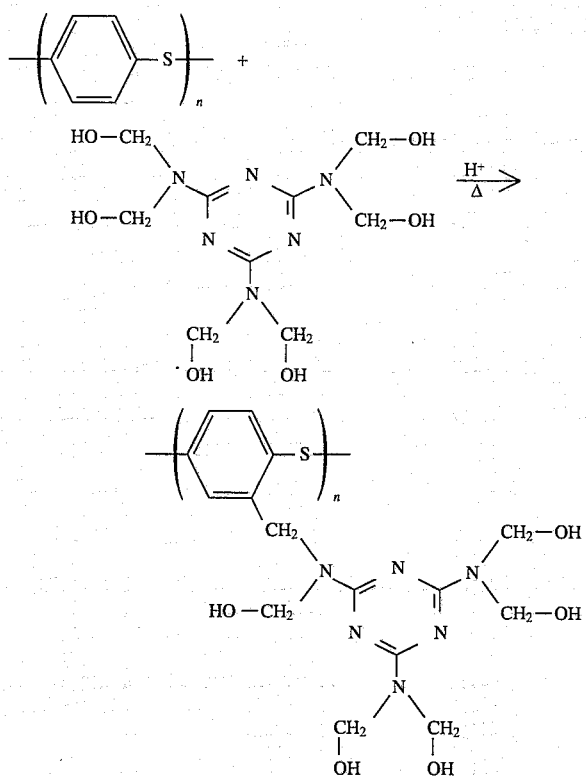

The above reaction converts the conducting polymer to a cross-linked three-dimensional polymer.

Thus, electron beam writing allows the photo acid generator to generate a Lewis acid; this acid makes the monomer (e.g. melamine) reactive with the conducting polymer; as a result, the conducting polymer becomes a polymer of cross-linked structure. Since the conducting polymer is solvent-soluble, the unexposed portions of the resist are dissolved in a developer; the exposed portions are difficultly soluble in the developer because the conducting polymer has been converted to a higher-molecular cross-linked polymer; thus, a negative type pattern is formed. Further, the resist film comprising the above-mentioned three components has a lower surface resistance and can prevent charging at the time of electron beam writing because the film contains the conducting polymer.

By using the above conductive resist film as a top-layer resist for tri-layer resist, there can be easily formed a multi-layer resist having a sufficiently high sensitivity as a result of chemical sensitization and also having conductivity; consequently, a negative type fine resist pattern can be formed easily and precisely without inviting any pattern distortion caused by charging.

Table 1 shows comparison of the process of the present invention with the conventional process.

TABLE 1

|  | Conventional process | Present process |
|---|---|---|
| Sensitivity | Δ | ○ |
| Dimensional change | Δ | ○ |
| Adhesion | Δ | ○ |
| Charging | x | ○ |
| Stability of development | x | ○ |
| Swelling | x | ○ |
| Number of steps | Δ | ○ |

Notes:
○ Excellent
Δ Fair
x Bad

The present invention is hereinafter described in detail by way of Examples. However, the present invention is in no way restricted to these Examples.

EXAMPLE 1

In ethyl cellosolve acetate were dissolved 1.0 g of 1,1-bis(p-chlorophenyl)-2,2,2-trichloroethane as a photo acid generator, 10.0 g of methyl ester of poly(methacrylic acid) and 15 g of a poly(n-hexylthiophene), to prepare a mixture. The mixture was gently stirred at 25° C. for 5 minutes and filtered to remove insolubles to obtain a uniform solution. This solution was dropped on a semiconductor substrate, and spin coating was effected at 2,000 rpm for 2 minutes. The wafer was baked at 90° C. for 20 minutes to obtain a resist film of 1.0 μm in thickness. Then, electron beam writing was effected at an accelerating voltage of 30 kV at a dose of 10 μC/cm². Thereafter, baking was effected at 110° C. for 20 minutes, whereby the hydrolysis of methyl ester of poly(methacrylic acid) by the acid generated was promoted. The water was subjected to development with an aqueous organic alkali solution for 6 minutes to obtain a positive type fine resist pattern precisely.

EXAMPLE 2

In cellosolve acetate were dissolved 1.0 g of 1,1-bis(p-methoxyphenyl)-2,2,2-trichloroethane as a photo acid generator, 10.0 g of a poly(p-vinylbenzoic acid ester) and 15 g of a poly(p-phenylene sulfide) to prepare a mixture. The mixture was gently stirred at 25° C. for 5 minutes and filtered to remove insolubles to obtain a uniform solution. This solution was dropped on a semi-conductor substrate, and spin coating was effected at 2,000 rpm for 2 minutes. The wafer was baked at 90° C. for 20 minutes to obtain a resist film of 1.0 μm in thickness. Then, electron beam writing was effected at an accelerating voltage of 30 kV at a dose of 10 μC/cm². Thereafter, baking was effected at 100° C. for 20 minutes, whereby the hydrolysis of the poly(p-vinylbenzoic acid ester) by the acid generated was promoted. The wafer was subjected to development with an aqueous organic alkali solution for 6 minutes to obtain a positive type fine resist pattern precisely.

EXAMPLE 3

The third Example of the present invention is explained with reference to FIGS. 1A to 1D. A high-molecular organic film of 2 μm in thickness was formed as a bottom layer film 12 on a semiconductor substrate 11, and baked at 220° C. for 20 minutes. Thereon was formed a high-molecular inorganic film of 0.2 μm in thickness as an intermediate layer 13, followed by baking at 200° C. for 20 minutes (FIG. 1A). Thereon was coated the solution obtained in Example 1, as a top layer electron beam resist 14, in a thickness of 0.5 μm, followed by baking at 90° C. for 20 minutes (FIG. 1B). Then, electron beam writing was effected at an accelerating voltage of 20 kV at a dose of 10 μC/cm$^2$, followed by baking at 120° C. for 20 minutes, whereby the hydrolysis by the acid generated was promoted. The resulting wafer was subjected to development with an aqueous organic alkali solution for 6 minutes to obtain a positive type fine submicron resist pattern 14P (0.4 μm line and space) precisely (FIG. 1C). Etching of the intermediate layer 13 and the bottom layer film 12 was effected using the resist pattern 14P as a mask to obtain a vertical fine submicron resist pattern 12P (0.4 μm line and space) precisely without inviting any dimensional change (FIG. 1D).

Thus, by using a highly sensitive conductive resist as a top-layer resist for tri-layer resist, a positive type fine resist pattern can be formed at a high precision. FIG. 3 shows an illustration of the surface of the resist pattern formed in this Example, prepared based on the scanning electron micrograph of the surface. As seen in FIG. 3, there was formed a fine resist pattern 12P precisely without inviting any error caused by charging, in the field butting portion 200.

EXAMPLE 4

In ethyl cellosolve acetate were dissolved 1.0 g of 1,1-bis(p-chlorophenyl)-2,2,2-trichloroethane as a photo acid generator, 2.0 g of methylolmelamine and 15 g of a poly(p-phenylene sulfide), to prepare a mixture. The mixture was gently stirred at 25° C. for 5 minutes and filtered to remove insolubles to obtain a uniform solution. This solution was dropped on a semiconductor substrate, and spin coating was effected at 2,000 rpm for 2 minutes. The wafer was baked at 90° C. for 20 minutes to obtain a resist film of 1.0 μm in thickness. Then, electron beam writing was effected at an accelerating voltage of 30 kV at a dose of 10 μC/cm$^2$. Thereafter, baking was effected at 110° C. for 20 minutes, whereby the crosslinking reaction between the melamine and the poly(p-phenylene sulfide) by the acid generated was promoted. The wafer was subjected to development with an aqueous organic alkali solution for 6 minutes to obtain a negative type fine resist pattern precisely.

EXAMPLE 5

In cellosolve acetate were dissolved 1.0 g of 1,1-bis(p-methoxyphenyl)-2,2,2-trichloroethane as a photo acid generator, 2.0 g of methylolmelamine and 15 g of poly(n-hexylthiophene), to prepare a mixture. The mixture was gently stirred at 25° C. for 5 minutes and filtered to remove insolubles to obtain a uniform solution. This solution was dropped on a semiconductor substrate, and spin coating was effected at 2,000 rpm for 2 minutes. The wafer was baked at 90° C. for 20 minutes to obtain a resist film of 1.0 μm in thickness. Then, electron beam writing was effected at an accelerating voltage of 30 kV at a dose of 10 μC/cm$^2$. Thereafter, baking was effected at 110° C. for 20 minutes, whereby the crosslinking reaction between the melamine and the polythiophene by the acid generated was promoted. The wafer was subjected to development with an aqueous organic alkali solution for 6 minutes to obtain a negative type fine resist pattern precisely.

EXAMPLE 6

Figure 2B:
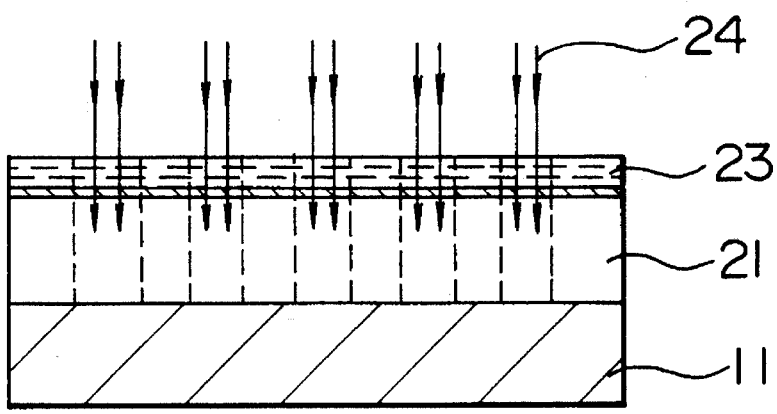
Figure 2C:
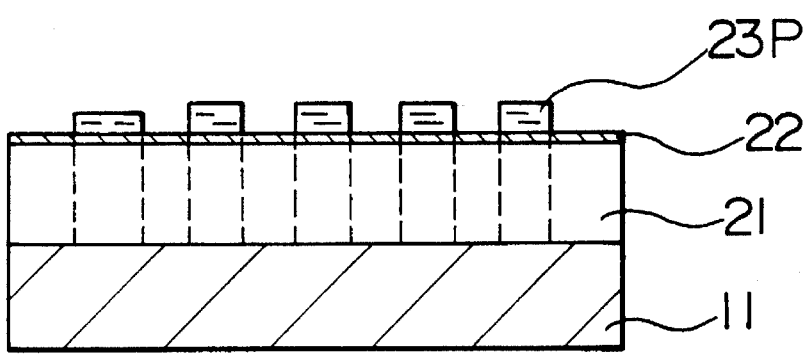
Figure 2D:
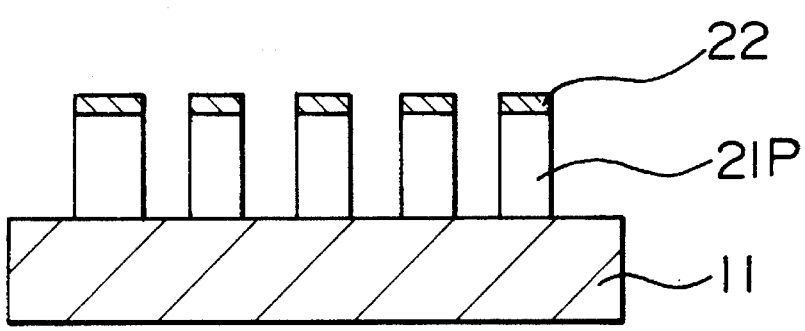
Figure 4A:
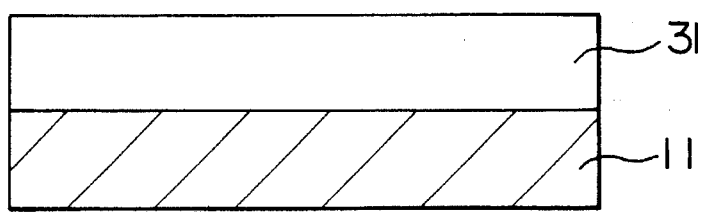
FIGS. 4A to 4D are sectional views showing the steps of the conventional pattern forming process using a multi-layer resist.
Figure 4B:
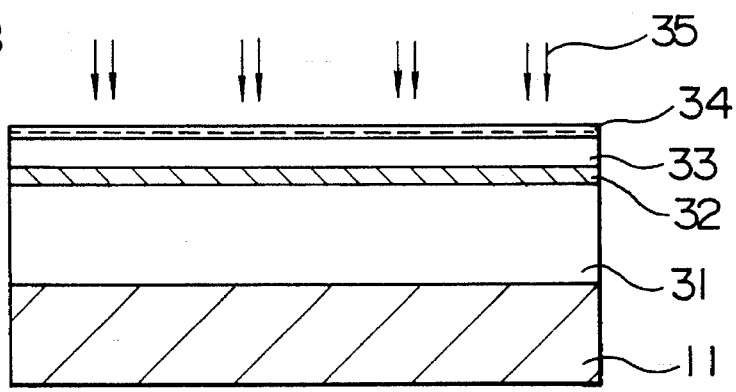
Figure 4C:
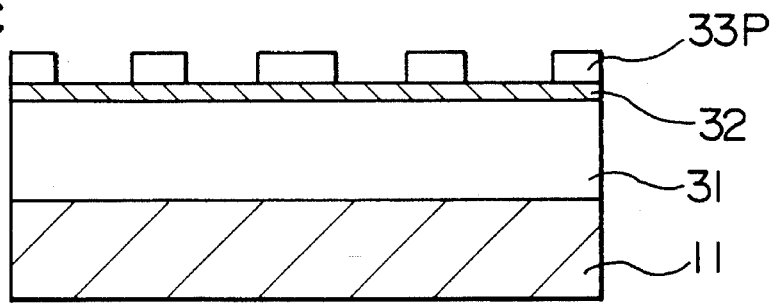
Figure 4D:
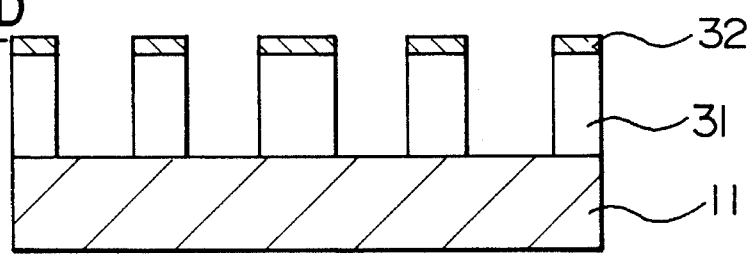
Figure 5:
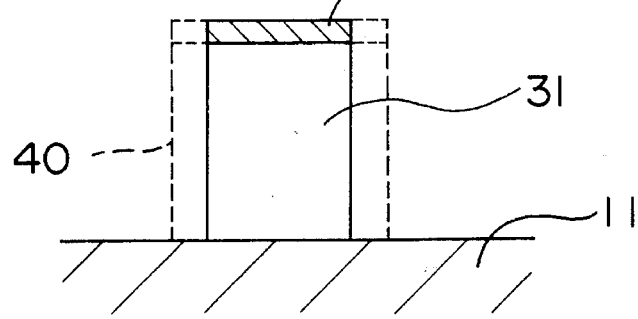
FIG. 5 is a sectional view showing an example of the dimensional change of pattern in the conventional pattern forming process using a multi-layer resist.
Figure 6:
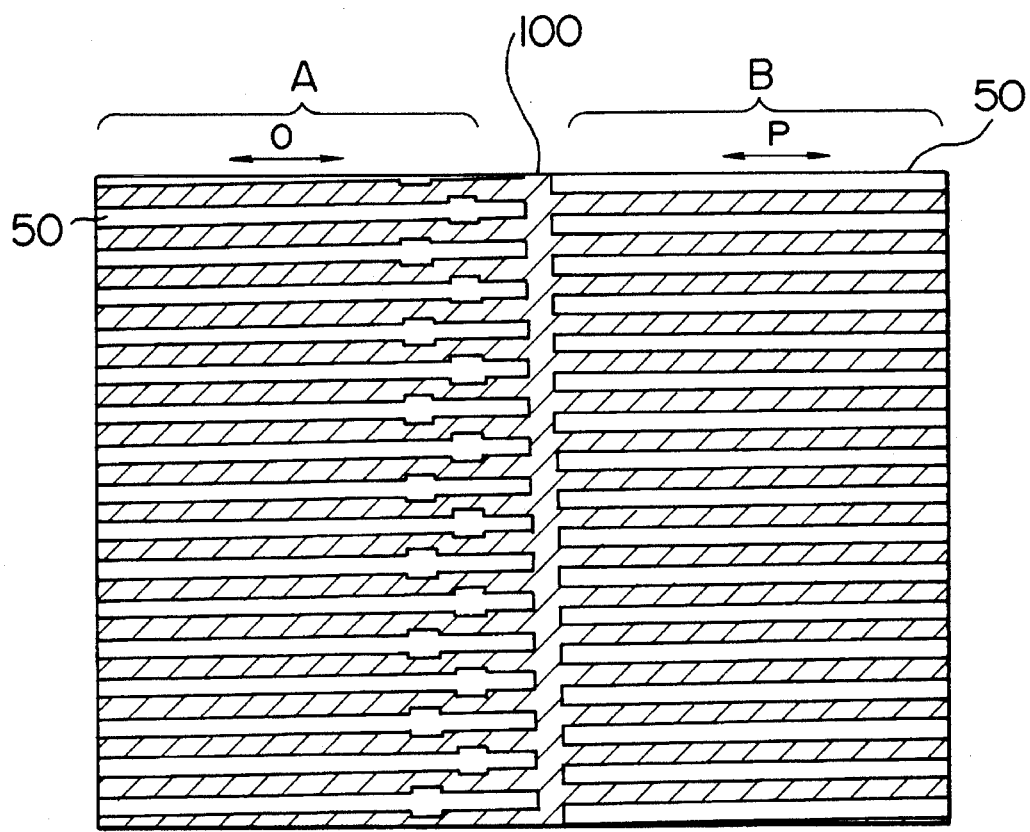
FIG. 6 is an illustration of the surface of the resist pattern formed in the conventional pattern forming process using a multi-layer resist having no aluminum film thereon, prepared based on the scanning electron micrograph of the surface.

The sixth example of the present invention is explained with reference to FIGS. 2A to 2D. A high-molecular organic film of 2 μm in thickness was formed as a bottom-layer film 21 on a semiconductor substrate 11, and baked at 220° C. for 20 minutes. Thereon was formed a high-molecular inorganic film of 0.2 μm in thickness as an intermediate layer 22, followed by baking at 200° C. for 20 minutes (FIG. 2A). Thereon was applied the solution obtained in Example 4, as a top layer electron beam resist 23, in a thickness of 0.5 μm, followed by baking at 90° C. for 20 minutes (FIG. 2B). Then, electron beam writing was effected at an accelerating voltage of 20 kV at a dose of 10 μC/cm$^2$ followed by baking at 120° C. for 20 minutes, whereby the crosslinking reaction by the acid generated was promoted. The resulting wafer was subjected to development with an aqueous organic alkali solution for 6 minutes to obtain a negative type fine resist pattern 23P precisely (FIG. 2C). Etching of the intermediate layer 22 and the bottom layer film 21 was effected using the resist pattern 23P as a mask to obtain a vertical fine resist pattern 21P precisely (FIG. 2D).

Thus, by using a highly sensitive conductive resist as a top-layer resist for tri-layer resist, a negative type fine resist pattern can be formed at a high precision.

In the present invention, a fine pattern can be formed easily and precisely without inviting any pattern distortion caused by charging, by using the above-mentioned conductive electron beam resist and a pattern forming process using the resist. In the present invention, it is not necessary to form a thin aluminum film by vapor deposition on the top-layer resist; there is no contamination problem; the steps are simpler; there is no dimensional change during pattern transfer; a pattern can be formed at a high sensitivity by the use of an acid catalyst; and a fine resist pattern can be formed precisely without inviting charging of the electron beam applied. Accordingly, the present invention enables precise formation of a fine pattern of high resolution.

As described above, in the present invention, a positive type resist pattern of high sensitivity and high resolution can be formed by using, as an electron beam resist, a mixture of an acid generator, an acid-decomposable polymer and a conducting polymer. By using the above resist having conductivity, as a top-layer resist for tri-layer resist, a vertical fine resist pattern can be formed easily and precisely without inviting any pattern distortion caused by charging. Further, a negative type resist pattern of high sensitivity and high resolution can be formed by using, as an electron beam resist, a mixture of an acid generator, a monomer to be made reactive by an acid and a conducting polymer. By using the above resist also having conductivity, as a top-layer resist for tri-layer resist, a vertical fine resist pattern can be formed easily and precisely without inviting any pattern distortion caused by charging, thus greatly contributing to the production of ultra large-scaled integrated circuits.

What is claimed is:

1. A process for forming a fine pattern, which comprises:

a step of forming a high-molecular weight organic film on a semiconductor substrate, followed by a heat treatment, a step of forming an inorganic film on the resulting high-molecular weight organic film, followed by a heat treatment, a step of forming, on the resulting inorganic film, a resist film comprising a monomer selected from the group consisting of melamine and methylolmelamine, a photo acid generator generating an acid upon irradiation with a charged beam and a conducting polymer, followed by a heat treatment, a step of irradiating the resulting resist film with a charged beam to write a pattern and generate the acid, followed by a heat treatment to react the generated acid with the monomer and thereby react said monomer with the conducting polymer, and then effecting development to form a resist pattern, and a step of etching the inorganic film and the high-molecular weight organic film using the resist pattern as a mask.

2. The process of claim 1, wherein the monomer is melamine.

3. The process of claim 1, wherein the monomer is methylolmelamine.

4. The process of claim 1, wherein the photo acid generator comprises organic halide compound.

5. The process of claim 1, wherein the photo acid generator comprises onium salt.

6. The process of claim 1, wherein the conducting polymer comprises a homopolymer selected from the group consisting of:

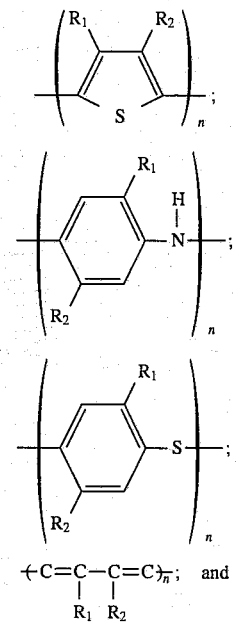

wherein $R_1$ and $R_2$ are an alkyl group and are the same or different.

* * * * *